(12) United States Patent
Aiba et al.

(10) Patent No.: US 6,387,445 B1
(45) Date of Patent: May 14, 2002

(54) TUNGSTEN LAYER FORMING METHOD AND LAMINATE STRUCTURE OF TUNGSTEN LAYER

(75) Inventors: Yasushi Aiba, Kofu; Yukio Koike, Yamanashi-Ken, both of (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/646,038

(22) PCT Filed: Jan. 11, 2000

(86) PCT No.: PCT/JP00/00078

§ 371 Date: Sep. 13, 2000

§ 102(e) Date: Sep. 13, 2000

(87) PCT Pub. No.: WO00/42232

PCT Pub. Date: Jul. 20, 2000

(30) Foreign Application Priority Data

Jan. 13, 1999 (JP) ............................................. 11-006506

(51) Int. Cl.[7] ........................ C23C 16/08; H01L 21/285
(52) U.S. Cl. ...................... 427/255.7; 438/656; 438/685
(58) Field of Search ................................ 428/620, 665, 428/636, 938, 641; 427/255.7, 250; 438/656, 685

(56) References Cited

U.S. PATENT DOCUMENTS

| | | | | |
|---|---|---|---|---|
| 4,892,843 A | * | 1/1990 | Schmitz et al. | 437/192 |
| 5,227,336 A | * | 7/1993 | Hirano et al. | 437/192 |
| 5,231,055 A | * | 7/1993 | Smith | 437/192 |
| 5,407,698 A | * | 4/1995 | Emesh | 427/99 |
| 5,444,018 A | * | 8/1995 | Yost et al. | 437/190 |
| 5,489,552 A | * | 2/1996 | Merchant | 437/192 |
| 5,643,632 A | * | 7/1997 | Lo | 427/250 |
| 5,661,080 A | * | 8/1997 | Hwang et al. | 438/654 |
| 5,804,249 A | * | 9/1998 | Sukharev et al. | 427/99 |
| 6,099,904 A | * | 8/2000 | Mak et al. | 427/253 |
| 6,156,382 A | * | 12/2000 | Rajgopalan et al. | 427/250 |

FOREIGN PATENT DOCUMENTS

| | | |
|---|---|---|
| JP | 3-47965 | 2/1991 |
| JP | 3-90572 | 4/1991 |
| JP | 6-275624 | 9/1994 |
| JP | 7-508072 | 9/1995 |
| JP | 10-125625 | 5/1998 |

* cited by examiner

Primary Examiner—John J. Zimmerman
(74) Attorney, Agent, or Firm—Smith, Gambrell & Russell, LLP

(57) ABSTRACT

A tungsten layer is formed on the surface of an object to be treated (e.g., a semiconductor wafer), supplying a process gas which includes a material gas of a tungsten fluoride (e.g., $WF_6$) gas and a reducing gas (e.g., $H_2$ gas) for reducing the material gas. In this case, an intermediate tungsten film forming step is carried out between a nuclear crystalline film forming step of forming a nuclear crystalline film of tungsten on the surface of the object and a main tungsten film forming step of forming a main tungsten film on the nuclear crystalline film. At the intermediate tungsten film forming step, an intermediate tungsten film is formed while the flow ratio of the material gas to the reducing gas is smaller than that at the main tungsten film forming step. Thus, the incubation time T2 after the deposition of the nuclear crystalline film is removed, so that it is possible to enhance the whole mean deposition rate and to improve the uniformity of the thickness between objects to be processed.

7 Claims, 11 Drawing Sheets

FIG. I

|  | TIME (sec) | PRESSURE (Pa) | TEMPE-RATURE (°C) | WF₆ (sccm) | Ar (sccm) | SiH₄ (sccm) | H₂ (sccm) | N₂ (sccm) |
|---|---|---|---|---|---|---|---|---|
| FORMATION OF NUCLEAR CRYSTALLINE FILM | 25 | 500 | 440 | 15 | 200 | 4 | 400 | 600 |
| FORMATION OF INTERMEDIATE TUNGSTEN FILM | 8 | 10670 | 420 | 30 | 900 | 0 | 1800 | 100 |
| FORMATION OF MAIN TUNGSTEN FILM | 19 | 10670 | 420 | 80 | 900 | 0 | 750 | 100 |

FIG. 3a

|  | TIME (sec) | PRESSURE (Pa) | TEMPE-RATURE (°C) | WF₆ (sccm) | Ar (sccm) | SiH₄ (sccm) | H₂ (sccm) | N₂ (sccm) |
|---|---|---|---|---|---|---|---|---|
| FORMATION OF NUCLEAR CRYSTALLINE FILM | 45 | 500 | 440 | 15 | 200 | 4 | 400 | 600 |
| FORMATION OF MAIN TUNGSTEN FILM | 19 | 10670 | 420 | 80 | 900 | 0 | 750 | 100 |

FIG. 3b

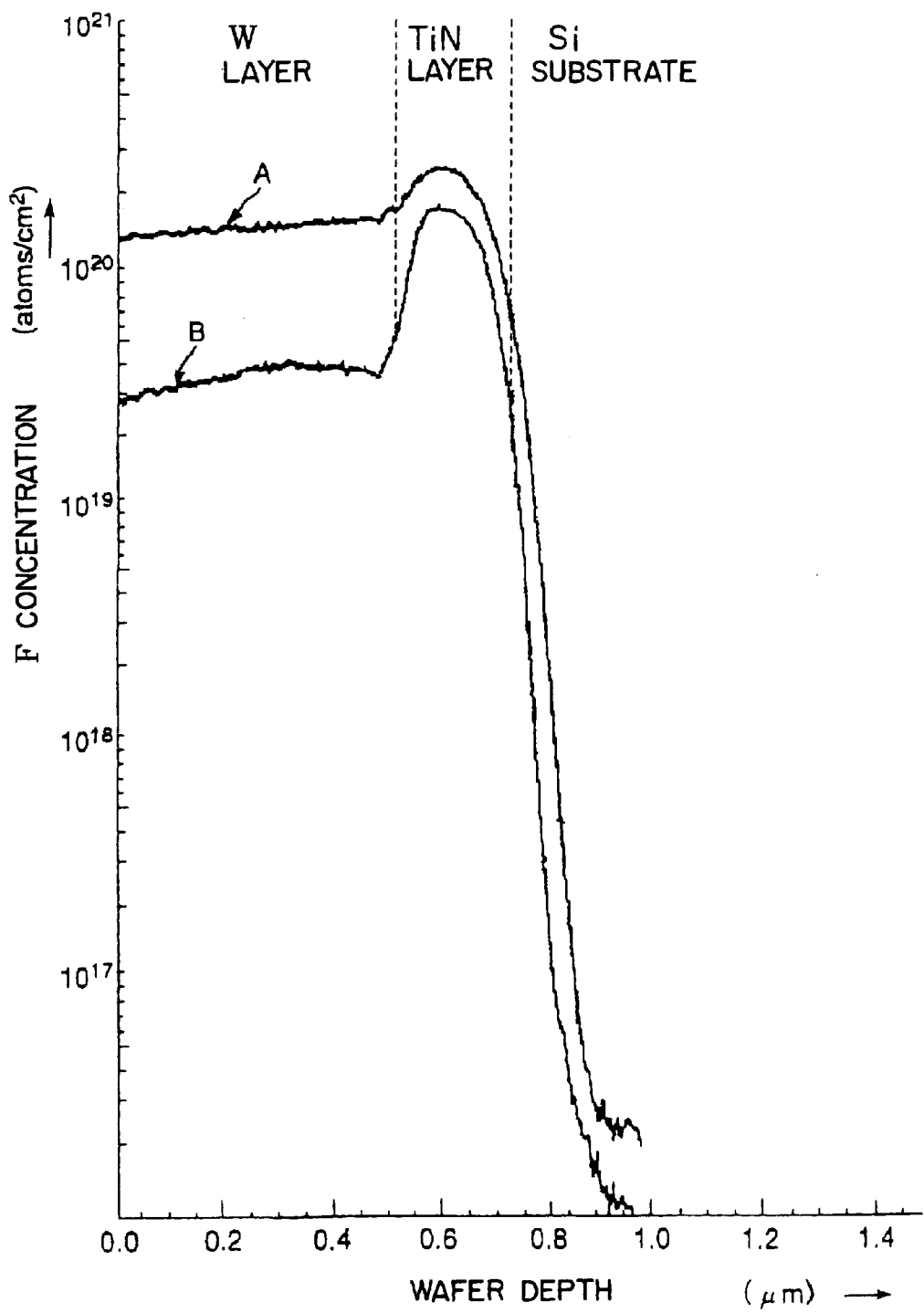
F I G. 5

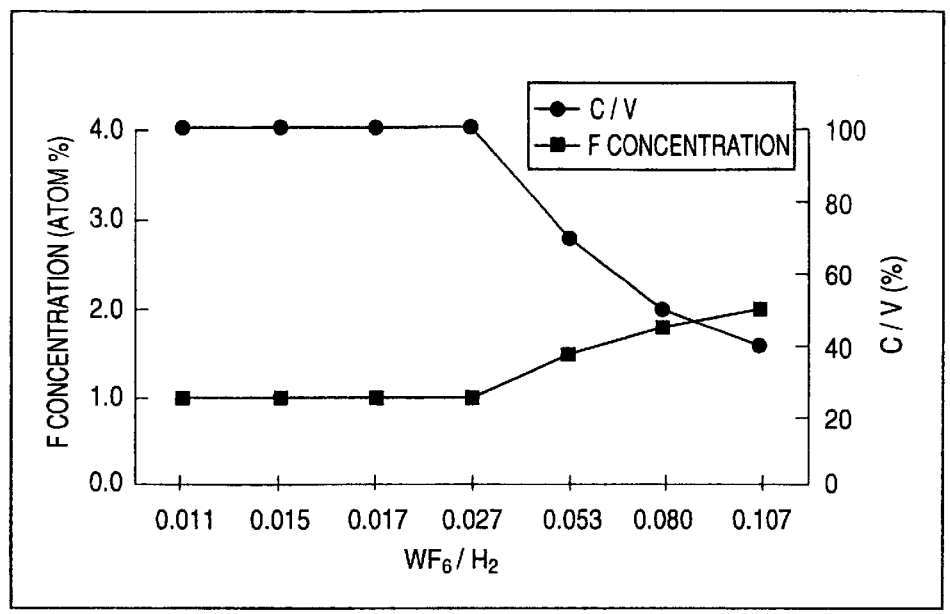
FIG. 6a
| WF$_6$ (sccm) | H$_2$ (sccm) | WF$_6$/H$_2$ (sccm) | F CONCENTRATION (ATOM %) | C/V (%) |
|---|---|---|---|---|
| 20 | 1900 | 0.0105 | 1.0 | 100 |
| 20 | 1350 | 0.0150 | 1.0 | 100 |
| 30 | 1800 | 0.0170 | 1.0 | 100 |
| 20 | 750 | 0.0270 | 1.0 | 100 |
| 40 | 750 | 0.0530 | 1.5 | 70 |
| 60 | 750 | 0.0800 | 1.8 | 50 |
| 80 | 750 | 0.1070 | 2.0 | 40 |
FIG. 6b
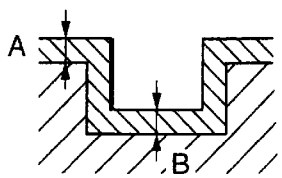
FIG. 6c

| WF$_6$ (sccm) | H$_2$ (sccm) | WF$_6$ / H$_2$ | DEPOSITION RATE (Å / min) | |
|---|---|---|---|---|
| 20 | 1900 | 0.0105 | 2300 | SUPPLY-LIMITED |
| 20 | 1350 | 0.0150 | 2450 | ↓ |
| 30 | 1800 | 0.0170 | 2450 | |
| 20 | 750 | 0.0270 | 2450 | |
| 40 | 750 | 0.0530 | 4200 | REACTION-LIMITED |
| 60 | 750 | 0.0800 | 4900 | ↓ |
| 80 | 750 | 0.1070 | 5200 | |

| | WF$_6$ (sccm) | H$_2$ (sccm) | WF$_6$/H$_2$ | 50Torr (6670Pa) | 60Torr (8000Pa) | 70Torr (9330Pa) | 80Torr (10670Pa) | 100Torr (13330Pa) | PROCESS PRESSURE |
|---|---|---|---|---|---|---|---|---|---|
| REACTION - LIMITED CONDITIONS | 80 | 750 | 0.1070 | 3100 | 3400 | 3500 | 3900 | 4300 | DEPOSITION RATE (Å/min) |
| SUPPLY - LIMITED CONDITIONS | 20 | 1900 | 0.0105 | 2300 | 2350 | 2400 | 2350 | 2450 | |

US 6,387,445 B1

TUNGSTEN LAYER FORMING METHOD AND LAMINATE STRUCTURE OF TUNGSTEN LAYER

TECHNICAL FIELD

The present invention relates generally to a method for forming a tungsten layer, which is formed on the surface of an object to be processed, such as a semiconductor wafer, and a laminated structure of a tungsten layer.

BACKGROUND ART

In a typical process for producing a semiconductor integrated circuit, a metal or metal compound, such as W (tungsten), WSi (tungsten silicide), Ti (titanium), TiN (titanium nitride) or TiSi (titanium silicide), is deposited to form a thin film, in order to form a wiring pattern on a semiconductor wafer serving as an object to be processed or in order to fill in a recessed portion between wiring parts or the like.

As methods for forming a metal thin film of this type, there are known three methods, such as the $H_2$ (hydrogen) reduction process, the $SiH_4$ (silane) reduction process and the $SiH_2Cl_2$ (dichlorosilane) reduction process. The $SiH_2Cl_2$ reduction process is a method for forming a W or WSi (tungsten silicide) film at a high temperature of about 600° C. using, e.g., dichlorosilane, as a reducing gas in order to form a wiring pattern. The $SiH_4$ reduction process is a method for forming a W or WSi film at a low temperature of about 450° C., which is lower than that in the $SiH_2Cl_2$ reduction process, using, e.g., silane, as a reducing gas in order to similarly form a wiring pattern.

The $H_2$ reduction process is a method for depositing a W film at a temperature of about 400° C. to about 450° C. using, e.g., hydrogen, as a reducing gas in order to fill a recessed portion in the surface of a wafer, such as a recessed portion between wiring parts.

In all of the above described cases, a gas, such as $WF_6$ (tungsten hexafluoride), is used as a material gas. An example of the formation of a tungsten layer of via-fill type and/or blanket type will be described. If a film is first intended to be formed by the CVD, the adhesion of the film is bad, so that an incubation time, in which the adhesion of the film does not occur, tends to increase.

Therefore, in order to prevent this, $WF_6$ gas serving as a material gas, and a reduction gas, such as silane or hydrogen gas, are first caused to flow little by little to allow a nuclear crystalline film of tungsten serving as a seed crystal to grow on the surface of a wafer. After this nuclear crystalline film growth step is carried out for a predetermined period of time, e.g., tens seconds, the material gas and the reducing gas are caused to flow in large quantities to allow a main tungsten film mainly including the nuclear crystalline film to grow at a high deposition rate. Thus, a tungsten layer having a desired thickness as a whole is obtained.

FIG. 10 schematically shows the sectional structure of the tungsten layer at this time. In FIG. 10, a nuclear crystalline film 2 of tungsten and a main tungsten film 4 are sequentially stacked on the surface of a semiconductor wafer 1. FIG. 11 is a graph showing the relationship between time and thickness of the film at the deposition step. As shown in FIG. 11, although a nuclear crystalline film forming step is carried out after a pretreatment, an incubation time T1, in which the film does not deposit for some time, exists after the nuclear crystalline film forming step starts. In addition, an incubation time T2, in which the film does not deposit for some time, also exists when a main tungsten film forming step starts after the nuclear crystalline film forming step. Then, (after a lapse of the incubation time T2) at the main tungsten film forming step, the adhesion of the film is carried out in large quantities.

By the way, the control of the thickness of a film to be deposited is generally carried out by controlling the gas flow rate and time. However, the incubation times T1 and T2 are considerably influenced by the state of the surface of the semiconductor wafer, e.g., the quality of an underlying film, such as a TiN film, when a tungsten film is deposited, so that it is difficult to artificially control the incubation times T1 and T2.

Therefore, even if the target thickness of the nuclear crystalline film 2 is set to be, e.g., 500 angstroms, one incubation time T1 varies, so that the thickness is, in fact, 600 angstroms or 400 angstroms as shown by the chain line in FIG. 11. In addition, since the other incubation time T2 also varies (not shown in FIG. 10), the substantial deposition time for the main tungsten film also varies.

Thus, even if the thickness of the nuclear crystalline film 2 and the substantial deposition time for the main tungsten film vary, the finally required thickness of the tungsten layer is, e.g., about 8000 angstroms, which is far greater than the above described variation in thickness of the nuclear crystalline film 2, e.g., 100 angstroms. In addition, since the variation in the incubation time T2 is far shorter than T1, the influence of the tungsten layer on the whole film thickness is very small. Therefore, since the difference in thickness between wafers is not so great, there is no problem due to the above described variation in substantial deposition time.

However, the multilayering of semiconductor integrated circuits is recently advanced, so that the thickness of various laminated films is decreased. For example, in the case of the above described tungsten layer, although the conventional target thickness is about 8000 angstroms, the recent target thickness is about 1000 angstroms, which is ⅛ as large as the conventional target thickness, by the recent request of the decrease of the thickness.

In such a situation, if the same deposition method as conventional methods is adopted, there are the following problems. That is, as shown in FIG. 12, when a tungsten layer having a target thickness of 1000 angstroms is formed, if the variations in incubation times T1 and T2 cause the variation in thickness of the nuclear crystalline film in the range of, e.g., from about 400 to about 600 angstroms, as described above. Then, the thickness of the main tungsten film greatly reflects directly the variation of thickness of the nuclear crystalline film.

Taking the variation in incubation time T2 into consideration, the target thickness (1000 angstroms) of the tungsten layer greatly varies by, e.g., ±10% (100 angstroms) or more. Therefore, the thickness is greatly different between wafers, so that there is a problem in that it is difficult to uniform the thickness of the film. In addition, by the existence of the incubation times T1 and T2, in which no film deposits, it is difficult to shorten the time required to form the tungsten layer.

In this case, it is considered to shorten the time required to carry out the whole nuclear crystalline film deposition step. However, if the time required to carry out this step is excessively shortened, the growth of the nuclear crystalline film is insufficient, so that there is the possibility that the film can not be sufficiently grow at a main tungsten film deposition step which is an after process.

DISCLOSURE OF THE INVENTION

The present invention has been made by effectively solving the above described problems. It is an object of the present invention to provide a method for forming a tungsten layer and a laminated structure of a tungsten layer, which can remove any incubation times after the deposition of a nuclear crystalline film to enhance the whole deposition rate and to enhance the uniformity in thickness of films between objects to be processed.

After the inventor has diligently studied the deposition of tungsten films, the inventor has obtained knowledge that an incubation time, which has been taken immediately after a nuclear crystalline film forming step, can be removed by carrying out an intermediate tungsten film forming step, in which the concentration of fluorine (F) in a process gas is smaller than that at a main tungsten film forming step, immediately after the nuclear crystalline film forming step, so that the deposition rate can be greatly improved as a whole.

Therefore, according to one aspect of the present invention, there is provided a method for forming a tungsten layer on the surface of an object to be treated, supplying a process gas which includes a material gas of a tungsten fluoride gas and a reducing gas for reducing the material gas, the method comprising: a nuclear crystalline film forming step of forming a nuclear crystalline film of tungsten on the surface of the object to be processed; a main tungsten film forming step of forming a main tungsten film on the nuclear crystalline film; and an intermediate tungsten film forming step of forming an intermediate tungsten film between the nuclear crystalline film forming step and the main tungsten film forming step, while the flow ratio of the material gas to the reducing gas is smaller than that at the main tungsten film forming step.

Thus, the incubation time, which has been taken immediately after the nuclear crystalline film forming step, is removed to be replaced with the intermediate tungsten film forming step. Since the flow ratio of the material gas to the reducing gas at the intermediate tungsten film forming step is smaller than that at the main tungsten film forming step, the quantity of fluorine causing to inhibit the reducing function is relatively decreased to promote the reduction of the material gas. Thus, the tungsten film is deposited without taking the incubation time which has been taken immediately after the nuclear crystalline film forming step. Therefore, the mean deposition rate increases as a whole, so that it is possible to shorten the process time. In addition, it is possible to prevent the variation in thickness which caused by the variation in incubation time. Moreover, the thickness of the film is easy to be controlled by removing the incubation time which is temporally unstable. Therefore, it is possible to improve the uniformity of the thickness of the film between objects to be processed by enhancing the reproducibility of the deposition.

That is, according to the present invention, the concentration of fluorine in the process gas at the intermediate tungsten film forming step is set to be lower than the concentration of fluorine in the process gas at the main tungsten film forming step.

In this case, the nuclear crystalline film forming step and the main tungsten film forming step may be carried out for about tens seconds, respectively, whereas the intermediate tungsten film forming step may be carried out for about 10 seconds.

The material gas is, e.g., $WF_6$ gas. In addition, the reducing gas is, e.g., hydrogen ($H_2$) gas, and in this case, the flow ratio of $WF_6$ gas to $H_2$ gas at the intermediate tungsten film forming step is preferably 0.04 or less.

Thus, it is possible to form an intermediate tungsten film, in which the variation in thickness due to process conditions, such as temperature and pressure, is small, at the intermediate tungsten film forming step while maintaining a supply limited state, in which a deposition reaction does not proceed in accordance with the supply of the process gas.

According to another aspect of the present invention, there is provided a laminated structure of a tungsten layer which is formed on the surface of an object to be processed, supplying a process gas which includes a material gas of a tungsten fluoride gas and a reducing gas for reducing the material gas, the laminated structure comprising: a nuclear crystalline film of tungsten formed on the surface of the object to be processed; a main tungsten film formed on the nuclear crystalline film; and an intermediate tungsten film formed between the nuclear crystalline film and the main tungsten film, the intermediate tungsten film being formed while the flow ratio of the material gas to the reducing gas is smaller than that when the main tungsten film is formed.

BRIEF DESCRIPTION OF THE DRAWINGS

FIG. 3a is a table showing an example of deposition conditions in a method for forming a tungsten layer according to the present invention;

FIG. 3b is a table showing deposition conditions in a conventional method for forming a tungsten layer;

FIG. 5 is a graph showing the comparison of profiles of the concentration of fluorine in a tungsten film when the flow rate of $WF_6$ gas is different;

FIG. 6a is a graph showing the relationship between the flow ratios of $WF_6$ gas to $H_2$, the concentrations of fluorine and C/V values;

FIG. 6b is a table showing the relationship of FIG. 6a by numerical values;

FIG. 6c is a schematic view for explaining the definition of the C/V value in FIG. 6a;

BEST MODE FOR CARRYING OUT THE INVENTION

Referring to the accompanying drawings, a preferred embodiment of a tungsten layer forming method and a laminated structure of a tungsten layer according to the present invention will be described in detail below.

Figure 1:
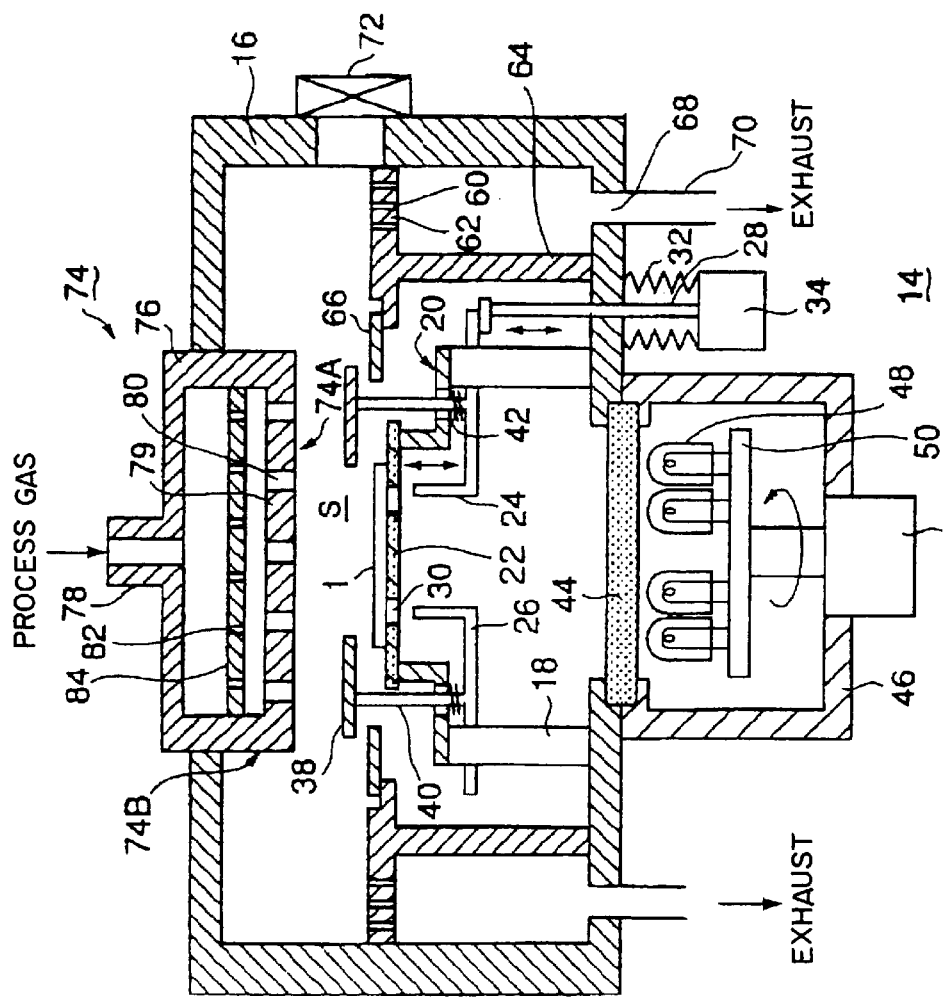
FIG. 1 is a sectional view of a deposition process system for carrying out a method for forming a tungsten layer according to the present invention.

Before describing a method according to the present invention, a deposition process system for carrying out a method according to the present invention will be described. FIG. 1 is a sectional view of a deposition process system for carrying out a method for forming a tungsten layer according to the present invention. This deposition process system 14 has a cylindrical or box-shaped vacuum process vessel 16 of, e.g., aluminum. In the process vessel 16, a cylindrical reflector 18, which is raised from the bottom of the process vessel, is provided. On the reflector 18, a mounting table 22 for mounting thereon a semiconductor wafer 1 serving as an object to be processed is provided via a holding member 20 having, e.g., an L-shaped cross section. The reflector 18 and the holding member 20 are made of a heat wave penetrating material, e.g., quartz. The mounting table 22 is made of, e.g., carbon material or an aluminum compound, such as AlN, having a thickness of about 1 mm.

Below the mounting table 22, a plurality of, e.g., three, lifter pins 24 are raised upwards from a supporting member 26. By vertically moving the supporting member 26 by means of a push-up rod 28 which passes through the bottom of the process vessel, the lifter pins 24 can vertically move the wafer 1 (via lifter pin holes 30 formed in the mounting table 22).

The bottom end of the push-up rod 28 is connected to an actuator 34 via a retractable bellow 32 for holding the airtight state in the process vessel 16. In order to hold the peripheral portion of the wafer 1 to fix the peripheral portion to the mounting table 22, a substantially ring-shaped clamp ring 38 of a ceramic, which has a shape corresponding to the profile of the wafer 1, is provided on the peripheral portion of the mounting table 22. The clamp ring 38 is connected to the supporting member 26 via a supporting rod 40 which passes through the holding member 20 while ensuring a gap between the supporting rod 40 and the holding member 20, and is designed to vertically move with the lifter pins 24. A coil spring 42 is provided around the supporting rod 40 between the holding member 20 and the supporting member 26. This assists the downward movement of the clamp ring 38 and so forth to ensure that the wafer is clamped. The lifter pins 24, the supporting member 26 and the holding member 20 are also made of a heat wave penetrating member of quartz.

In addition, a transmission window 44 of a heat wave penetrating material, such as quartz, is airtightly provided in the bottom of the process vessel directly below the mounting table 22. Below the transmission window 44, a box-shaped heating chamber 46 is provided so as to surround the transmission window 44. In the heating chamber 46, a plurality of heating lamps 48 serving as a heating part are mounted on a rotating table 50 also serving as a reflecting mirror. The rotating table 50 is rotated by a rotating motor 54 which is provided on the bottom of the heating chamber 46 via a rotating shaft. Therefore, heat waves emitted from the heating lamps 48 pass through the transmission window 44, so that the bottom face of the mounting 22 is irradiated with the heat waves to be heated. Furthermore, a resistance heater may be provided as the heating means in place of the heating lamps 48.

Around the outer periphery of the mounting table 22, a ring-shaped current plate 62 having a large number of straightening holes 60 is supported on a cylindrical supporting column 64. On the inner peripheral side of the current plate 62, there is provided a ring-shaped attachment 66 of quartz for contacting the outer periphery of the clamp ring 38 to prevent gas from flowing below the clamp ring 38. An exhaust port 68 is provided in the bottom of the process vessel 16 below the current plate 62. The exhaust port 68 is communicated with an exhaust passage 70 which is connected to a vacuum pump (not shown), so that a predetermined degree of vacuum can be maintained in the process vessel 16. On the side wall of the process vessel 16, there is provided a gate valve 72 which is open and closed when the wafer is introduced into and discharged from the process vessel 16.

On the other hand, the ceiling portion of the process vessel facing the mounting table 22 is provided with a shower head part 74 for introducing a process gas and so forth into the process vessel 16. Specifically, the shower head part 74 has a cylindrical, box-shaped head body 76 of, e.g., aluminum. The ceiling portion of the head body 76 is provided with a gas inlet 78.

The gas inlet 78 is connected to a gas source for a gas required to carry out the process, e.g., for $WF_6$, Ar, $SiH_4$, $H_2$ or $N_2$ gas, via a gas passage so as to be able to control the flow rate thereof.

In the bottom portion 79 of the head body 76, a large number of gas nozzles 80 for emitting a gas, which is supplied into the head body 76, to a process space S. These gas nozzles 80 are arranged substantially in the whole plane of the bottom portion 79 of the head body 76, to emit the gas over the surface of the wafer. In addition, in the head body 76, a diffusion plate 84 having a large number of gas dispersing holes 82 is provided for uniformly supplying the gas to the surface of the wafer.

Figure 2:
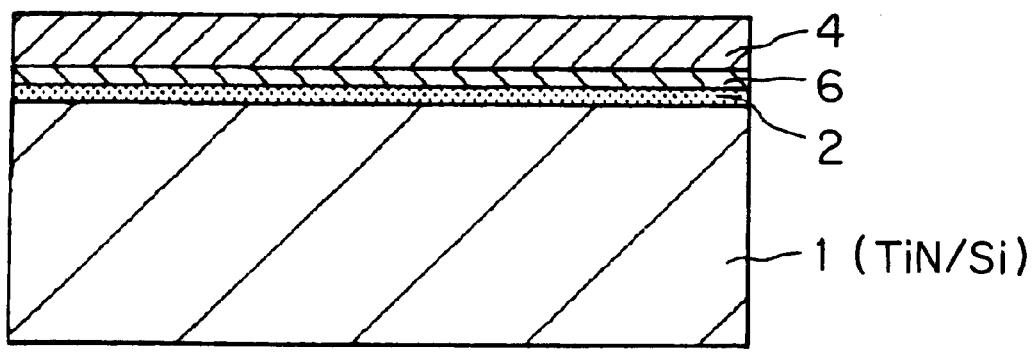
FIG. 2 is a partially enlarged sectional view showing a laminated structure of a tungsten layer according to the present invention.

A method for forming a tungsten layer according to the present invention, which is carried out using the system with the above described construction, and a laminated structure of a tungsten layer, which is formed by the method, will be described below. FIG. 2 is a partially enlarged sectional view of a laminated structure of a tungsten layer according to the present invention, and FIG. 3 is a graph showing the relationship between time chart and thickness for explaining a method according to the present invention. Furthermore, in FIG. 3, a conventional method is shown by the chain line.

As shown in FIG. 2, on the surface of a semiconductor wafer 1 of, e.g., silicon (Si) single crystal, serving as an object to be processed, a nuclear crystalline film 2 of tungsten, and an intermediate tungsten film 6 and a main tungsten film 4, which serve as the feature of the present invention, are sequentially stacked by a method according to the present invention which will be described later. These three films 2, 4 and 6 constitute a tungsten layer on the wafer 1 as a whole. Below the nuclear crystalline film 2, an underlying film, such as a TiN film, (not shown) is formed as a barrier layer. The formation of such a tungsten layer is carried out generally for forming a wiring film or filling contact holes or via holes, or for simultaneously carrying out both of the formation of a wiring film and the filling of contact holes or via holes. In addition, processes for depositing the above described three films 2, 4 and 6 are substantially continuously carried out in the same deposition process system.

A method for forming a tungsten layer will be described in detail below.

First, in the deposition system shown in FIG. 1, the gate valve 72 provided on the side wall of the process vessel 16 is open to introduce a wafer 1 into the process vessel 16 by means of a transfer arm. Then, the lifter pins 24 are moved upward to deliver the wafer 1 to the lifter pins 24. Then, the push-up rod 28 is moved downward to lower the lifter pins 24 to mount the wafer 1 on the mounting table 22, and the push-up rod 28 is further moved downwards to press and fix the peripheral portion of the wafer 1.

Then, process gases, such as $WF_6$ (material gas), $SiH_4$ and $H_2$ (reducing gas), are supplied in predetermined quantities from process gas sources (not shown) to the shower head part 74 to be mixed therein. Then, the process gases are substantially uniformly supplied to the process vessel 16 from the gas nozzles 80 of the bottom face of the head body 76. Simultaneously, the process vessel 16 is evacuated from the exhaust port 68 to be set so as to have a predetermined degree of vacuum. In addition, heat is emitted while rotating the heating lamp 48 arranged below the mounting table 22.

The emitted heat waves pass through the transmission window 44, so that the reverse surface of the mounting table 22 is irradiated with the heat waves to be heated. As described above, the mounting table 22 is rapidly heated since it has a very small thickness of about 1 mm. Therefore, the wafer 1 mounted thereon can be rapidly heated to a predetermined temperature. The supplied process gases cause a predetermined chemical reaction, so that, e.g., a nuclear crystalline film 2 of tungsten, an intermediate tungsten film 6 and a main tungsten film 4, which are shown in FIG. 2, are deposited on the surface of the wafer 1.

More specifically, in this method, a nuclear crystalline forming step, an intermediate tungsten film forming step and a main tungsten film forming step are sequentially and substantially continuously carried out. Among these steps, the nuclear crystalline film forming step is a step of forming the nuclear crystalline film 2 of tungsten on the surface of the wafer 1 serving as an object to be processed. In addition, the main tungsten film forming step is a step of forming the main tungsten film 4 on the nuclear crystalline film 2. Moreover, the intermediate tungsten film forming step is a step of forming the intermediate tungsten film 6 while the flow ratio of $WF_6$ (a material gas) to $H_2$ (a reducing gas) is smaller than that at the main tungsten film forming step, between the nuclear crystalline film forming step and the main tungsten film forming step.

FIG. 3a shows an example of deposition conditions at the respective steps when an 8-inch (20 cm) wafer is used. In this example, the gas flow rate and the deposition time are set to aim to form a tungsten film having a thickness of 1000 angstroms as a whole by depositing a nuclear crystalline film 2 and intermediate tungsten film 6, which have a thickness of 500 angstroms together, and by further depositing a main tungsten film 4 having a thickness of 500 angstroms. In addition, deposition conditions in the conventional deposition method are shown in FIG. 3b for reference.

Figure 4:
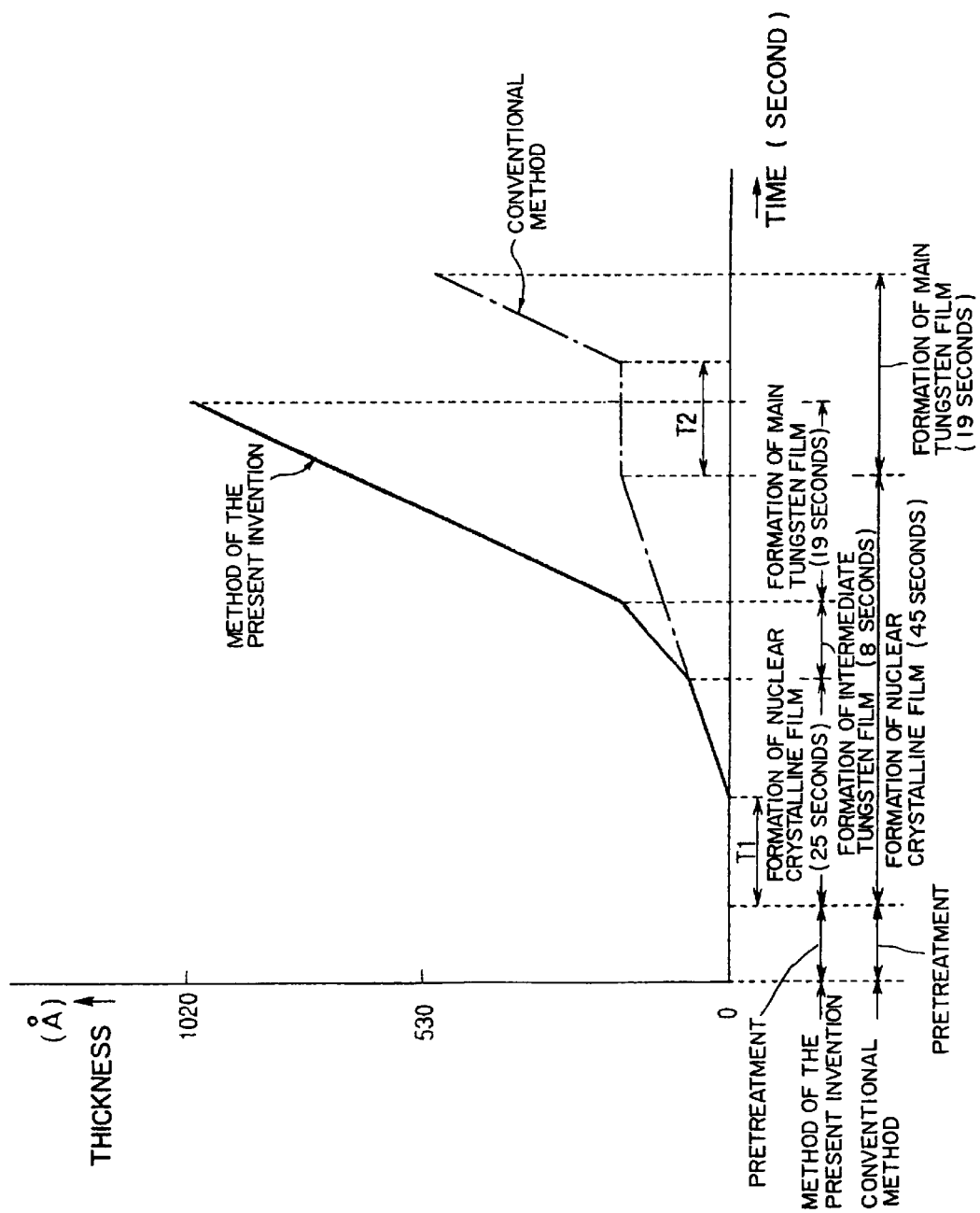
FIG. 4 is a graph showing the relationship between time and thickness at a deposition step, for explaining a method for forming a tungsten layer according to the present invention.

As shown in FIG. 4, before the deposition starts, the pretreatment of the semiconductor wafer 1 is carried out for a predetermined period of time, e.g., tens seconds. This pretreatment is intended to cause a small amount of $SiH_4$ to flow with $H_2$, Ar and $N_2$ to form a nuclear crystal of silicon. This pretreatment assists the growth of a nuclear crystal of tungsten which is subsequently formed.

After this pretreatment is completed, the nuclear crystalline film forming step is carried out. At this step, $SiH_4$ and $WF_6$ gases, together with Ar, $H_2$ and $N_2$, are supplied to reduce the $WF_6$ gas to deposit a nuclear crystalline film 2 of tungsten (see FIG. 2). In this case, the flow rate of the WF6 gas is set to be a vary small flow rate of 15 sccm, and temperature and pressure are also set so that the nuclear crystal is easy to grow. At this nuclear crystalline growth step, the nuclear crystalline film 2 starts to be deposited after an incubation time T1 which is an irregular term, in which no film deposits. This point is the same as that in the conventional method.

After the nuclear crystalline film forming step is carried out for a predetermined period of time, 25 seconds in this example (45 seconds in the conventional method), a predetermined purge operation and so forth are carried out, and thereafter, the intermediate tungsten film forming step is carried out. At this step, temperature is slightly lowered to 420° C., and pressure is greatly raised to 10666 Pa. Then, the supply of $SiH_4$ is stopped, and the feed rate of $WF_6$ gas is increased. Moreover, the feed rates of Ar gas and $H_2$ gas serving as a reducing gas are greatly increased, whereas the feed rate of $N_2$ gas is decreased. Although the feed rate of $WF_6$ gas is greater than that at the nuclear crystalline film forming step, the flow rate of $WF_6$ and the flow ratio of $WF_6$ gas to $H_2$ are set to be smaller than those of $WF_6$ gas at the subsequent main tungsten film forming step. That is, in the conventional method, after the nuclear crystalline film forming step, a large quantity of $WF_6$ gas is caused to flow at a stretch to shift to the main tungsten film forming step, whereas in the method according to the present invention, the feed rate of $WF_6$ gas is suppressed to some extent to shift to the intermediate tungsten film forming step. Thus, the suppression of the feed rate of $WF_6$ gas suppresses the concentration of fluorine which causes the inhibition of the deposition. Furthermore, the fact that fluorine atoms cause the inhibition of the deposition will be described later.

In addition, since a large quantity (1800 sccm) of $H_2$ gas having a reducing function is supplied, the reduction of $WF_6$ gas is promoted by the synergism of the decrease of the concentration of fluorine and the increase of $H_2$ gas. Thus, the incubation time T2, which has been conventionally taken, is not taken, so that the intermediate tungsten film 6 (see FIG. 2) is immediately formed. At this time, the deposition rate is higher than that of the above described nuclear crystalline film 2. This intermediate tungsten film forming step may be carried out for a very short period of time, e.g., about 8 seconds. Because it is possible to form the lower concentration of fluorine on the surface of the wafer, even if the intermediate tungsten film forming step is carried out for such a very short period of time.

Thus, the intermediate tungsten film forming step is completed, the main tungsten film forming step is carried out. At this step, the flow rate of $WF_6$ gas serving as a material gas is greatly increased (to be about three times or less as large as that at the nuclear crystalline film forming step), and the flow rate of $H_2$ gas serving as a reducing gas is decreased (to about half of that at the nuclear crystalline film forming step). The pressure and temperature conditions are the same as those at the intermediate tungsten film forming step. Thus, after the deposition of the intermediate tungsten film 6, the deposition of the main tungsten film 4 is continuously carried out. The deposition time of the main tungsten film 4 is about 19 seconds which is the same as that in the conventional method. In the above described case, the flow ratio of $WF_6$ gas to $H_2$ gas is 30/1800=0.017 at the intermediate tungsten film forming step, and 80/750=0.107 at the main tungsten film forming step. The latter is about 6 times as large as the former.

As shown in FIG. 4, after the above described deposition process, according to the present invention, the thickness of the whole tungsten layer obtained in the whole process time of 52 seconds (=25+8+19) was about 1020 angstrom which was very close to the target thickness (1000 angstroms). In the case of the conventional method, the thickness of the whole tungsten layer obtained in the whole process time of 64 seconds (=45+19) was only about 530 angstroms.

Thus, immediately before the main tungsten film forming step, the immediate tungsten film forming step, at which the flow ratio of $WF_6$ in the process gas is decreased to relatively decrease the concentration of fluorine, is carried out, so that the incubation time T2, which has been conventionally taken after the nuclear crystalline film forming step, can be removed. Therefore, it is possible to increase a mean deposition rate as a whole, so that it is possible to deposit a tungsten film having a desired thickness in a short time. The mean deposition rate means a mean deposition rate (=thickness/deposition time) until the main tungsten film forming step is completed after the nuclear crystalline film forming step starts.

In addition, since it is possible to remove the incubation time T2 which is temporally unstable, it is possible to precisely control the thickness of the tungsten layer as a whole although the tungsten layer has a small thickness of about 1000 angstroms.

The influence of the concentration of fluorine in the process gas on the deposition of the tungsten film will be described below. FIG. 5 is a graph showing the concentration of fluorine in a tungsten film when the flow rate of $WF_6$ gas is varied. Curve A shows a profile of the concentration of fluorine (atoms/cm$^2$) when the flow rates of $WF_6$ and $H_2$ are 80 sccm and 750 sccm, respectively, as deposition conditions, and curve B shows a profile of the concentration of fluorine when the flow rates of $WF_6$ and $H_2$ are 20 sccm and 1900 sccm, respectively, as deposition conditions. As can be clearly seen from this graph, the concentration of fluorine (F) in the tungsten (W) layer is greater, in curve A wherein the flow ratio of $WF_6$ to $H_2$ is greater. That is, since this method is basically a deposition method for reducing $WF_6$ gas with $H_2$ gas (removing as HF), it can be guessed that the concentration of fluorine in the process gas increases to inhibit the deposition of the tungsten film when the flow ratio of $WF_6$ to $H_2$ gas increases.

In fact, after the concentration of fluorine in the intermediate tungsten film 6 on the deposition conditions of FIG. 3a was measured, it was a low level which could not be measured by a detector. On the other hand, when the deposition was carried out on the conventional deposition conditions of FIG. 3b, the concentration of fluorine in a portion of the main tungsten film contacting the nuclear crystalline film was 2.06~4.91×10$^{19}$ (atoms/cm$^2$).

In the above described example shown in FIG. 3a, when the intermediate tungsten film forming step is changed to the main tungsten film forming step, the flow rate of $WF_6$ gas is increased by about 2.7 (=80/30), and the flow ratio of $WF_6$ gas to $H_2$ is increased by about 6.3 (=10.7/1.7). However, these numerical values are examples, and the flow rate and flow ratio should not be limited to these value if the concentration of fluorine in the intermediate tungsten film 6 can be decreased to an extent, in which the concentration can not be detected by a detector.

Therefore, the desired range of the flow ratio of $WF_6$ gas to $H_2$ gas will be described below. First, FIG. 6a shows the results of an experiment wherein the relationship between the flow ratios ($WF_6/H_2$) of $WF_6$ gas to $H_2$, the concentrations of fluorine and C/V values was examined (numerical values are shown in FIG. 6b). In this case, with respect to the tungsten layer formed in a recessed portion (an aspect ratio of 3) on the wafer shown in FIG. 6c, it was assumed that the ratio (B/A) of the thickness B on the bottom of the recessed portion to the thickness A on the surface portion was a C/V value (%). Furthermore, the process conditions other than the flow rates and flow ratio ($WF_6/H_2$) of $WF_6$ and $H_2$ were the same as those shown in FIG. 3a.

According to the results shown in FIGS. 6a and 6b, in a range wherein the flow ratio ($WF_6/H_2$) is below 0.027, the concentration of fluorine is held to be 1.0 (atomic %), and the C/V value is held to be 100%. On the other hand, in a range wherein the flow ratio ($WF_6/H_2$) exceeds 0.027, as the flow ratio ($WF_6/H_2$) increases, the concentration of fluorine increases to 2.0 (atomic %), and the C/V value decreases to 40%.

Figures 7A, 7B:
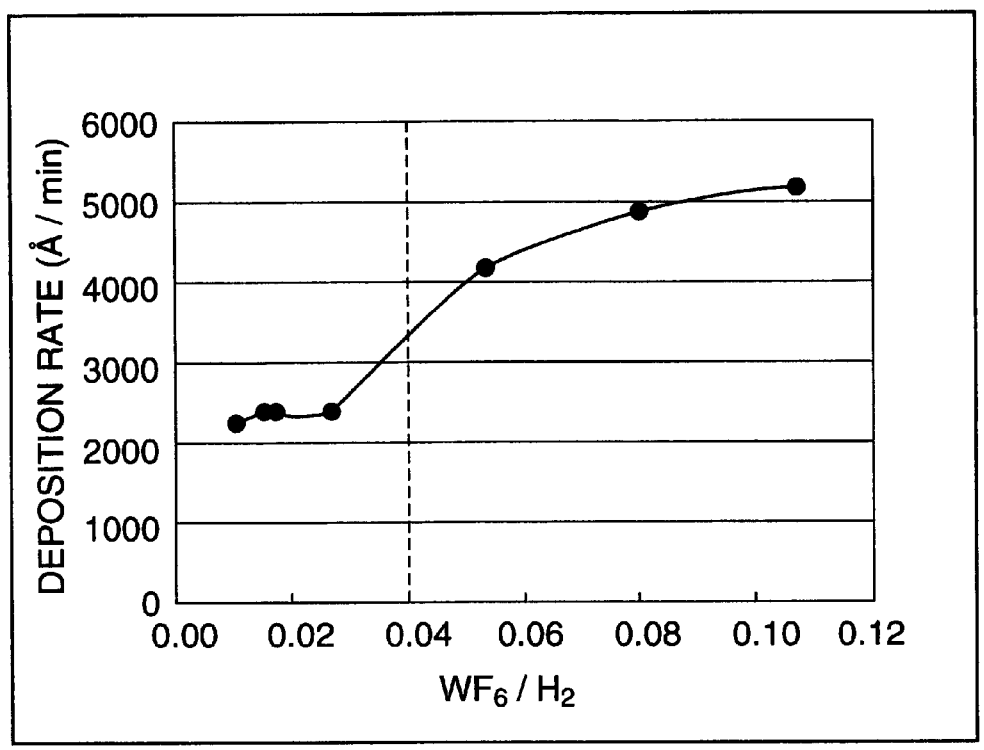
FIG. 7a is a graph showing the relationship between the flow ratios of $WF_6$ gas to $H_2$ and deposition rates.
FIG. 7b is a table showing the relationship of FIG. 7a by numerical values.

Then, FIG. 7a shows the results of an experiment wherein the relationship between the flow ratios ($WF_6/H_2$) and deposition rates at the intermediate tungsten film forming step was examined on the same process conditions (numerical values are shown in FIG. 7b).

According to the results shown in FIGS. 7a and 7b, in a range wherein the flow ratio ($WF_6/H_2$) is below 0.027, the deposition rate is in the range of from 2300 to 2450 (angstrom/minute). It is considered that a "supply limited (rate-determining) state", in which the deposition reaction does not proceed in accordance with the supply of the process gas, is formed in such a low flow ratio region.

On the other hand, in a range wherein the flow ratio ($WF_6/H_2$) exceeds 0.053, the deposition rate is in the range of from 3600 to 3850 (angstrom/minute). It is considered that a "reaction limited (rate-determining) state", in which the deposition reaction proceeds in accordance with the supply of the process gas, is formed in such a high flow ratio region. It is also considered that the boundary between the "supply limited state" and the "reaction limited state" exists at a flow ratio ($WF_6/H_2$) of 0.04.

Figure 8:
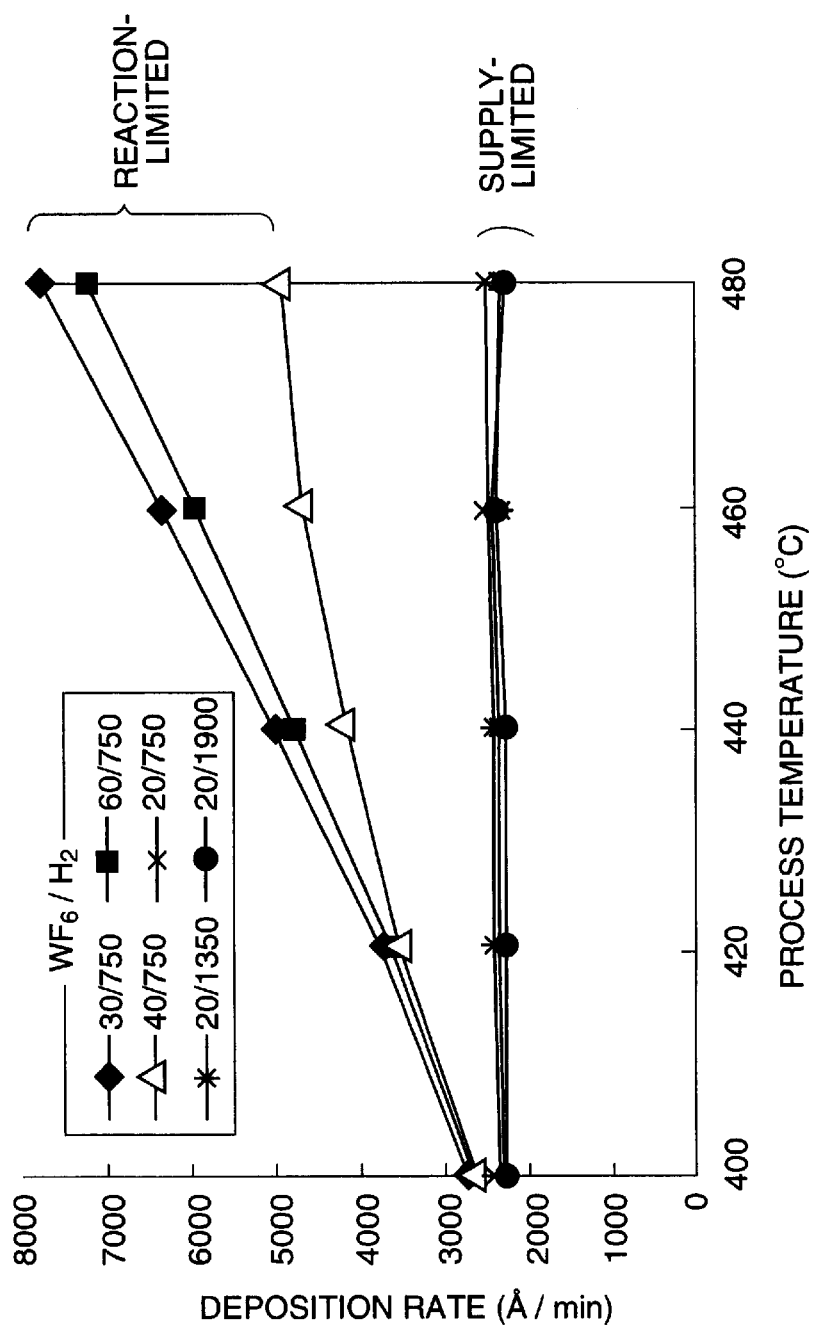
FIG. 8 is a graph showing the relationship between process temperatures and deposition rates by comparing the case of a reaction limited with the case of a supply limited.

FIG. 8 shows the results of an experiment wherein the relationship between process temperatures and deposition rates was examined in the reaction limited and supply limited states. According to the results shown in FIG. 8, in the reaction limited state (a flow ratio of 0.107 to 0.053), the deposition rate increases as the process temperature increases, whereas in the supply limited state (a flow ratio of 0.0105 to 0.027), the deposition rate hardly varies even if the process temperature varies.

Figures 9A, 9B:
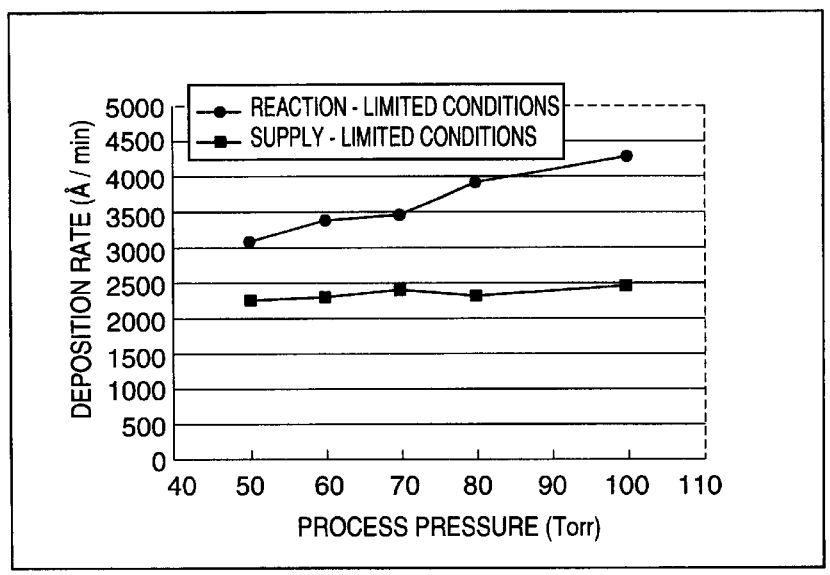
FIG. 9a is a graph showing the relationship between process pressures and deposition rates by comparing the case of a reaction limited with the case of a supply limited.
FIG. 9b is a table showing the relationship of FIG. 9a by numerical values.
Figure 10:
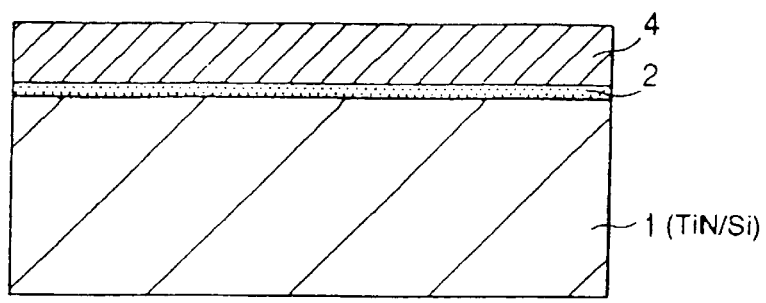
FIG. 10 is a partially enlarged sectional view showing a conventional laminated structure of a tungsten layer formed on a semiconductor wafer.
Figure 11:
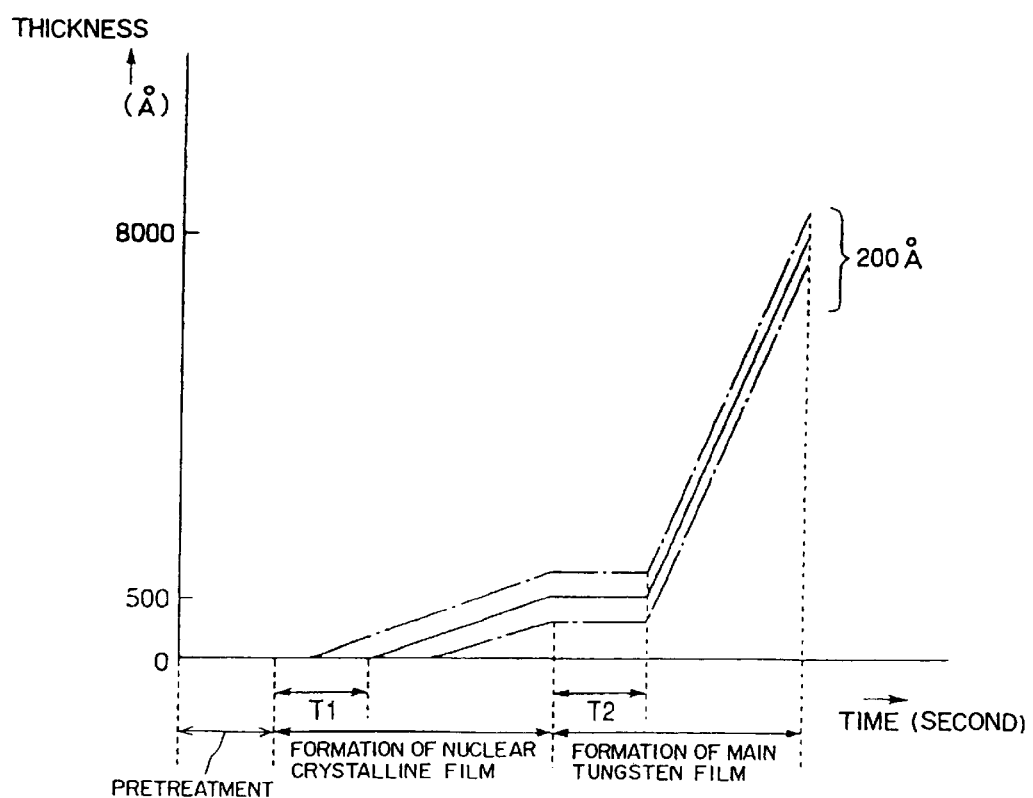
FIG. 11 is a graph showing the relationship between time and thickness at a deposition step.
Figure 12:
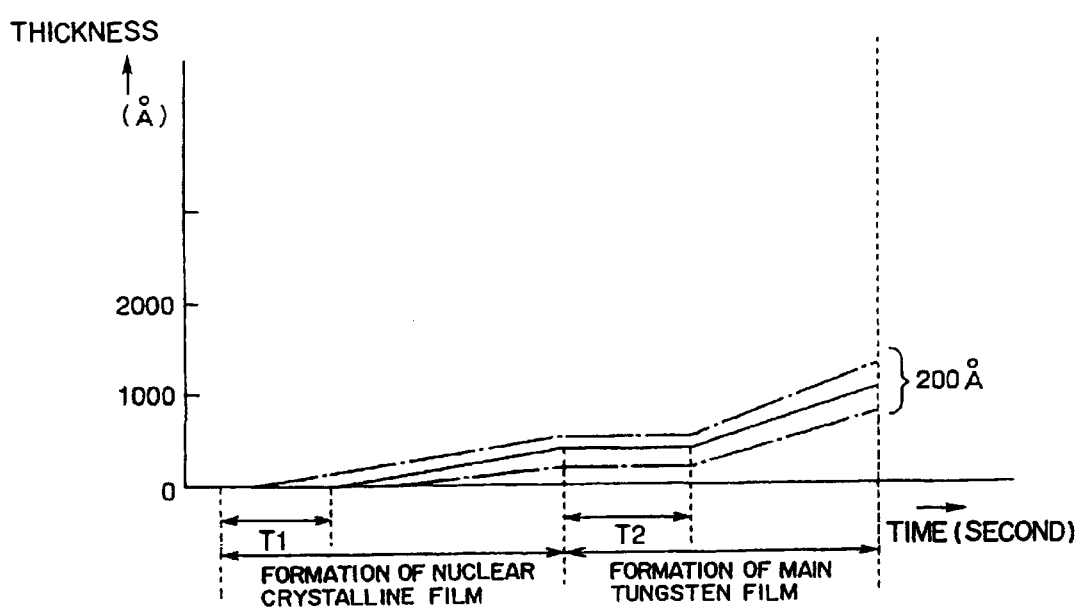
FIG. 12 is the same figure as FIG. 11 for explaining the influence of incubation times when the target thickness is small.

FIG. 9a shows the results of an experiment wherein the relationship between process pressure and deposition rates was examined in the reaction limited and supply limited states (numerical values are shown in FIG. 9a). According to the results shown in FIGS. 9a and 9b, in the reaction limited state (a flow ratio of 0.107), the deposition rate increases as the process pressure increases, whereas in the supply limited state (a flow ratio of 0.0105), the increase of the deposition rate due to the variation in process pressure is very small.

In view of the foregoing, the flow ratio of $WF_6$ gas to $H_2$ gas at the intermediate tungsten film forming step is preferably 0.04 or less. Thus, at the intermediate tungsten film forming step, the "supply limited state" can be maintained to form an intermediate tungsten film having a small variation in thickness due to process conditions, such as temperature and pressure.

Furthermore, the present invention should not be limited to the above described preferred embodiments. For example, the material gas should not be limited to the above described $WF_6$ gas, but any one of other tungsten fluoride gases may be used as the material gas. In addition, the reducing gas should not be limited to the above described $H_2$ gas, but other reducing gases capable of reducing the tungsten fluoride gas serving as the material gas may be used. Moreover, the object to be processed should not be limited to the semiconductor wafer, but LCD substrates and glass substrates may be used as the object to be processed.

In addition, there is considered a tungsten layer forming method wherein the intermediate tungsten film forming step continues until a predetermined thickness is obtained and the subsequent main tungsten film forming step is omitted.

What is claimed is:

1. A method for forming a tungsten layer on a surface of an object to be treated by supplying a process gas which includes a material gas of a tungsten fluoride gas and a reducing gas for reducing the material gas, said method comprising:

a nuclear crystalline film forming step of forming a nuclear crystalline film of tungsten on the surface of said object to be processed;

an intermediate tungsten film forming step of forming an intermediate tungsten film on said nuclear crystalline film; and a main tungsten film forming step of forming a main tungsten film on said intermediate tungsten film in a reaction limited state, said intermediate tungsten film forming step being carried out in a supply limited state wherein the flow ratio of said material gas to said reducing gas is smaller than that at said main tungsten film forming step.

2. A tungsten layer forming method as set forth in claim 1, wherein the concentration of fluorine in said process gas at said intermediate tungsten film forming step is lower than the concentration of fluorine in said process gas at said main tungsten film forming step.

3. A tungsten layer forming method as set forth in claim 1 or 2, wherein said nuclear crystalline film forming step and said main tungsten film forming step are carried out for about tens seconds, respectively, whereas said intermediate tungsten film forming step is carried out for about 10 seconds.

4. A tungsten layer forming method as set forth in claim 1, wherein said material gas is $WF_6$ gas.

5. A tungsten layer forming method as set forth in claim 1, wherein said reducing gas comprises $H_2$ gas and/or $SiH_4$ gas.

6. A tungsten layer forming method as set forth in claim 1, wherein said supply limited state is formed in a range, in which the flow ratio of $WF_6$ gas serving as said material gas to $H_2$ gas serving as said reducing gas is less than 0.04.

7. A tungsten layer forming method as set forth in claim 1, wherein said reaction limited state is formed in a range, in which the flow ratio of $WF_6$ gas serving as said material gas to $H_2$ gas serving as said reducing gas is 0.04 or more.

* * * * *